United States Patent
Chong et al.

(10) Patent No.: US 9,142,427 B2
(45) Date of Patent: Sep. 22, 2015

(54) METHODS OF MAKING AN INTERPOSER STRUCTURE WITH EMBEDDED CAPACITOR STRUCTURE

(71) Applicant: Micron Technology, Inc., Boise, ID (US)

(72) Inventors: Chin Hui Chong, Singapore (SG); David J. Corisis, Nampa, ID (US); Choon Kuan Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/180,567

(22) Filed: Feb. 14, 2014

(65) Prior Publication Data
US 2014/0162412 A1   Jun. 12, 2014

Related U.S. Application Data

(62) Division of application No. 11/685,816, filed on Mar. 14, 2007, now Pat. No. 8,653,625.

(51) Int. Cl.
| | |
|---|---|
| H01L 29/00 | (2006.01) |
| H01L 21/4763 | (2006.01) |
| H01L 21/48 | (2006.01) |
| H01L 23/50 | (2006.01) |
| H01L 23/00 | (2006.01) |
| H01L 49/02 | (2006.01) |

(52) U.S. Cl.
CPC ............ *H01L 21/4857* (2013.01); *H01L 23/50* (2013.01); *H01L 24/82* (2013.01); *H01L 28/40* (2013.01); *H01L 2924/0002* (2013.01); *H01L 2924/10253* (2013.01)

(58) Field of Classification Search
CPC ............ H01L 23/642; H01L 23/49827; H01L 23/49833
USPC .................................................. 438/381–392
See application file for complete search history.

(56) References Cited

U.S. PATENT DOCUMENTS

| | | |
|---|---|---|
| 5,982,027 A | 11/1999 | Corisis |
| 6,072,690 A | 6/2000 | Farooq et al. |
| 6,274,937 B1 | 8/2001 | Ahn et al. |
| 6,285,070 B1 | 9/2001 | Corisis et al. |
| 6,381,141 B2 | 4/2002 | Corisis et al. |
| 6,515,359 B1 | 2/2003 | Corisis et al. |
| 6,563,192 B1 | 5/2003 | Corisis et al. |
| 6,717,071 B2 | 4/2004 | Chang et al. |
| 7,071,542 B2 | 7/2006 | Corisis et al. |
| 7,327,554 B2 | 2/2008 | Otsuka et al. |
| 2002/0017399 A1 | 2/2002 | Chang et al. |
| 2002/0102768 A1 | 8/2002 | Shioga et al. |
| 2008/0224292 A1 | 9/2008 | Hui et al. |

*Primary Examiner* — Cuong Q Nguyen
(74) *Attorney, Agent, or Firm* — Perkins Coie LLP (57) ABSTRACT

A device is disclosed which includes an interposer, at least one capacitor formed at least partially within an opening formed in the interposer and an integrated circuit that is operatively coupled to the interposer. A method is disclosed which includes obtaining an interposer having at least one capacitor formed at least partially within an opening in the interposer and operatively coupling an integrated circuit to the interposer. A method is also disclosed which includes obtaining an interposer comprising a dielectric material, forming an opening in the interposer and forming a capacitor that is positioned at least partially within the opening.

12 Claims, 6 Drawing Sheets

METHODS OF MAKING AN INTERPOSER STRUCTURE WITH EMBEDDED CAPACITOR STRUCTURE

CROSS-REFERENCE TO RELATED APPLICATION

This application is a divisional of U.S. application Ser. No. 11/685,816 filed Mar. 14, 2007, now U.S. Pat. No. 8,653,625, which is incorporated herein by reference.

BACKGROUND OF THE INVENTION

1. Technical Field

The subject matter disclosed herein is generally directed to the field of semiconductor manufacturing, and, more particularly, to an interposer structure with an embedded capacitor structure and various methods of making same.

2. Description of the Related Art

Integrated circuit technology uses electrical devices, e.g., transistors, resistors, capacitors, etc., to formulate vast arrays of functional circuits. The complexity of these circuits requires the use of an ever-increasing number of linked electrical devices so that the circuit may perform its intended function. As the number of transistors increases, the integrated circuitry dimensions shrink. One challenge in the semiconductor industry is to develop improved methods for electrically connecting and packaging circuit devices which are fabricated on the same and/or on different wafers or chips. In general, it is desirable in the semiconductor industry to construct transistors which occupy less surface area on the silicon chip/die.

Conventionally, an integrated circuit device receives power from a power supply and is provided with a connection to ground, e.g., via a connection to $V_{SS}$. Normally, the power and ground connections are connected to the integrated circuit device through power and ground planes. One issue with power and ground planes in modern integrated circuit devices is that they contribute to inductive ringing. In memory devices, ringing due to package self-inductance can slow down the external interface. It is very desirable to minimize the inductive path for the power supply and ground connections to improve the performance of the integrated circuit.

Inductive ringing has been addressed previously by increasing the number of power and ground lines such that each line handles a reduced capacitive load. However, increasing the number of lines may contribute to increased package size, which may also be undesirable. Conventional power supply and ground planes may be positioned on the semiconductor die contributing to larger die size. It is desirable to minimize, to the greatest possible extent, the die size to enable smaller integrated circuit devices to be produced.

Another issue with power supply and ground planes is the necessity to provide capacitive decoupling. Commonly, decoupling capacitors are used to provide the necessary decoupling for the integrated circuit device. Again, these decoupling devices add to cost and size.

Circuit boards and other carrier substrates or platforms, both single- and multi-level, are employed to mechanically support and electrically connect both active devices, such as semiconductor dies, as well as passive components, such as resistors, capacitors and inductors. Conventional system in package (SIP) and multi-chip package (MCP) assemblies typically include discrete components of both classes, e.g., resistors, capacitors and inductors, as well as various solid state "chips" or "dies" hard wired, plugged, soldered, ball-bonded or otherwise electrically connected to a conductor network carried by a platform such as a card, board or other substrate. In the prior art, discrete capacitors as well as resistors and inductors are often required to be placed on the platform in combination with adjacent, associated semiconductor die, for example in the construction of a single in-line memory module (SIMM) or dual in-line memory module (DIMM). With the increased circuit densities required by ever-faster processors and larger memories, due to a generally fixed board or platform area, commonly termed "real estate" in the semiconductor industry, the use of discrete passive components is viewed as an undesirable but hitherto necessary waste of real estate which could otherwise be applied to better and higher uses.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the subject matter disclosed herein.

Figure 1:
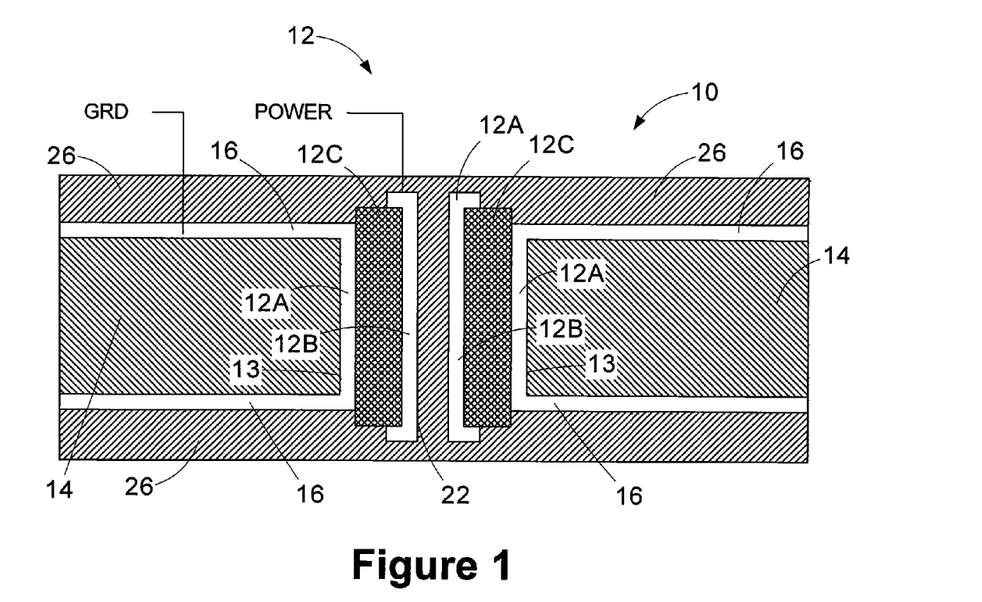
FIG. 1 is a cross-sectional view of an embodiment of a device disclosed herein.
Figure 2:
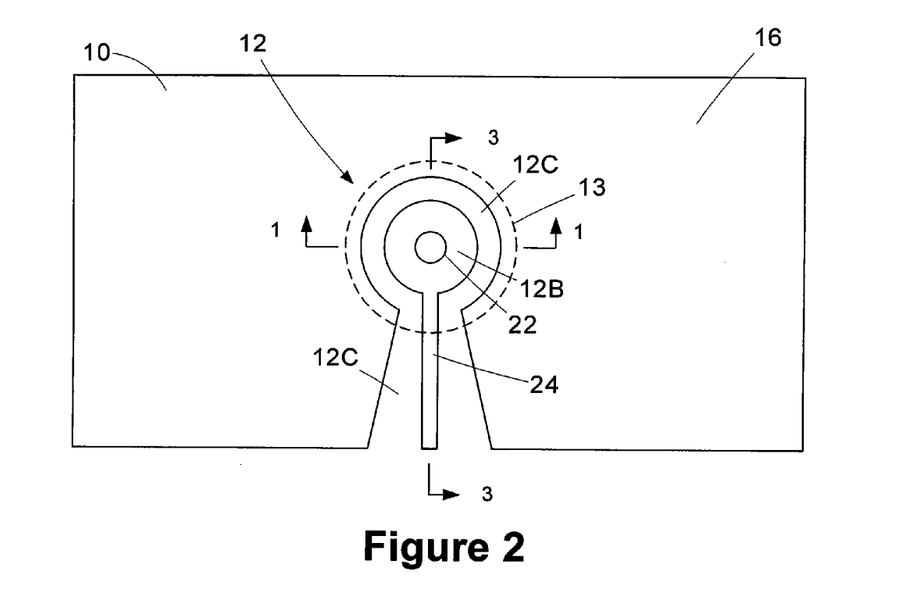
FIG. 2 is a top view of an embodiment of a device disclosed herein.
Figure 3:
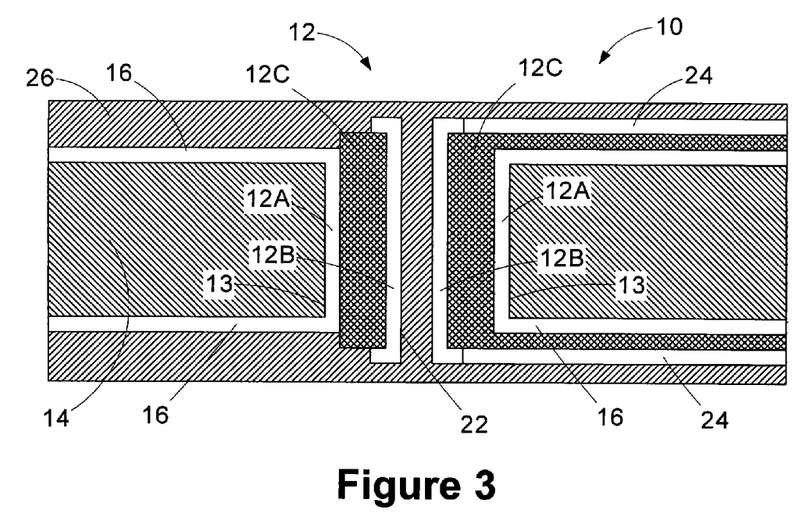
FIG. 3 is a cross-sectional view of another embodiment of a device disclosed herein.

FIGS. 1-3 are various views of an illustrative capacitor structure 12 formed at least partially within an opening defined in an interposer structure 10. In general, the capacitor structure 12 comprises a first conductive structure 12A and a second conductive structure 12B that are separated from one another by a dielectric material 12C. An inner surface 13 of a portion of the first conductive structure 12A is also depicted in FIGS. 1-3. In FIG. 2, the insulating material 26 is not depicted for purposes of clarity.

Of course, different electrical power levels may be supplied to the first and second conductive structures 12A, 12B. In the depicted example, the first conductive structure 12A may be electrically coupled to ground while the second conductive structure 12B may be coupled to a power supply. Other arrangements are possible as well. Illustrative conductive wiring traces 24 that are conductively coupled to the second conductive structure 12B are also depicted in FIGS. 2 and 3. In the depicted examples, the illustrative conductive traces 24 are electrically coupled to both the top and bottom of the second conductive structure 12B. Other arrangements are also possible. For example, conductive coupling may be established on only one end, e.g., the top, of the second conductive structure 12B. Additionally, conductive contact in the second conductive structure 12B may be accomplished by other known techniques, e.g., wire bonding. Thus, the illustrative example depicted herein of various techniques and structures for establishing electrical connection with the first or second conductive structures 12A, 12B should not be considered a limitation of the present invention.

In general, the interposer structure 10 is intended to be representative in nature in that it may be any structure that may be positioned adjacent an integrated circuit device and provide one or more conductive pathways for electrically coupling the integrated circuit device to other circuits or devices. In the depicted example, the interposer structure 10 comprises a body 14 comprised of a dielectric material and conductive material 16 formed on opposite sides of the body 14. In one illustrative example, the body 14 may be comprised of bismalemide triazine (BT), FR4, FR5 and the like, and the conductive material 16 may be copper, although other material combinations are possible. An insulating material 26 is positioned around the capacitor structure 12 and above the insulating material 26. The size and configuration of the capacitor structure 12 may vary depending upon the particular application. Additionally, a plurality of such capacitor structures 12, having the same or different size or construction, may be formed in the interposer structure 10. For purposes of clarity, only the formation of a single such capacitor structure 12 is discussed in detail.

Figure 4:
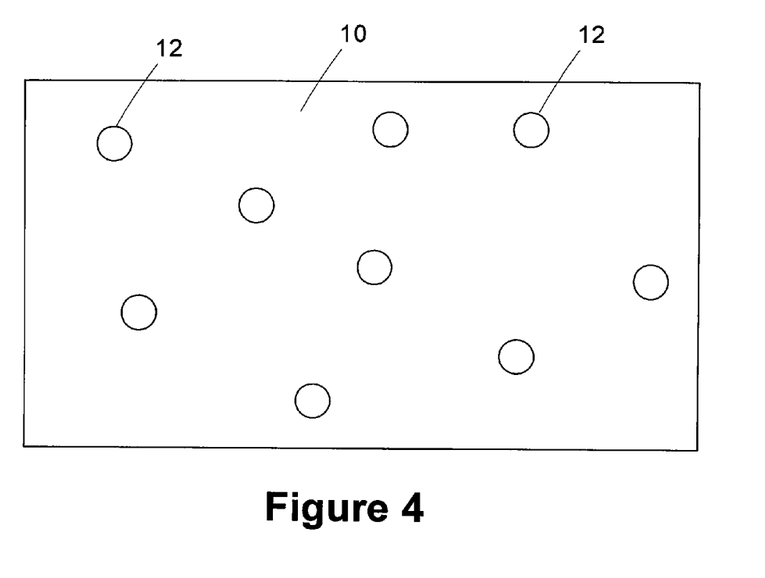
FIG. 4 is a top view of an embodiment of an interposer structure disclosed herein.

As shown in FIG. 4, the interposer structure 10 may comprise a plurality of schematically depicted capacitor structures 12 positioned therein. The size, number and location of the capacitor structures 12 on a particular interposer structure 10 may vary depending upon the particular application. Moreover, the capacitor structures 12 may be positioned in a random or ordered arrangement in the interposer structure 10. By way of example only, nine illustrative capacitor structures 12 are depicted in FIG. 4 as being formed in the interposer structure 10, and they have a random pattern.

Figure 5:
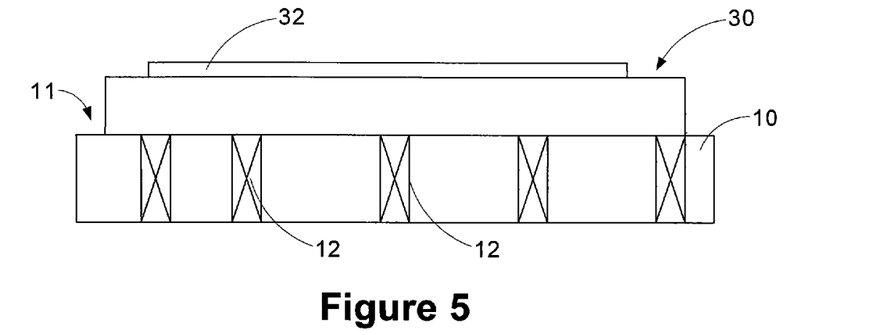
FIG. 5 is a schematic cross-sectional side view of an interposer structure and an integrated circuit device structure disclosed herein.

FIG. 5 schematically depicts an integrated circuit device structure 30 that is positioned above and secured above a mounting surface 11 of the schematically depicted interposer structure 10 using a variety of known techniques. The capacitor structures 12 in the interposer structure 10 are schematically depicted in FIG. 5. The integrated circuit device structure 30 may comprise one or more schematically depicted integrated circuit devices 32, the structure and nature of which may vary depending upon the particular application. For example, the integrated circuit device 32 may comprise one or more transistors, it may be a memory device, a microprocessor, an application specific integrated circuit (ASIC), a DRAM device, a PSRAM device, a NAND device, an imager device, etc. The integrated circuit device structure 30 may cover or be positioned above all of the capacitor structures 12 in the interposer structure 10, or it may cover less than all of the capacitor structures 12. It should also be understood that, when reference is made to a device or structure being formed or positioned above or over another structure, such terminology is employed in a relative sense, not an absolute sense. Ultimately, a mold compound material or epoxy material may be positioned around all or portions of the components depicted in FIG. 5 in accordance with known techniques.

Figure 6A:
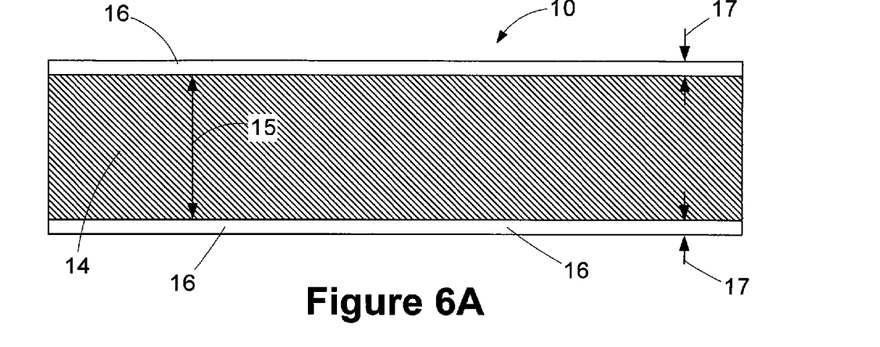
FIGS. 6A-6J depict one embodiment of a process flow for forming a capacitor structure described herein.

FIGS. 6A-6J depict one illustrative process flow for forming the capacitor structures 12 described herein. FIG. 6A depicts an illustrative interposer structure 10 comprising the body 14 of dielectric material and conductive material 16 formed on opposite sides of the body 14. As set forth previously, the body 14 may be comprised of a variety of materials, e.g., BT, FR4, FR5, glass weave, epoxy, etc. Similarly, the conductive material 16 may be comprised of a variety of materials, e.g., copper, gold, aluminum, etc. The thickness of the body 14 may also vary depending upon the particular application. In one illustrative example, the body 14 may have a thickness 15 of approximately 40-500 μm, and the conductive material 16 may have a thickness 17 of approximately 12-18 μm.

Figure 6B:
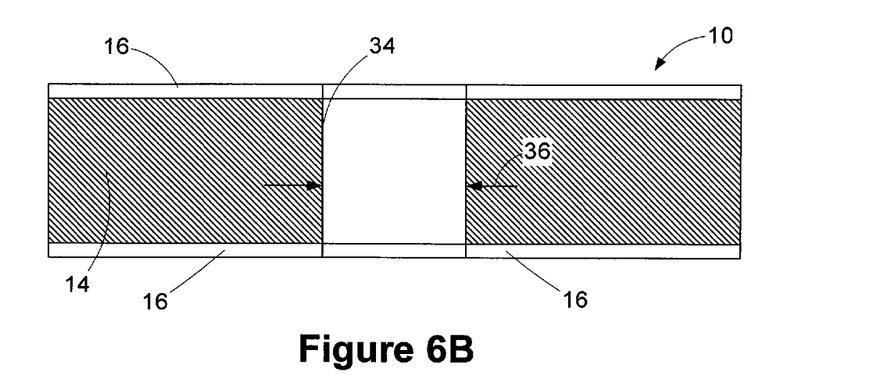

As shown in FIG. 6B, an opening 34 is formed in the interposer structure 10. The opening 34 may be of any desired shape, size or configuration, and it may be formed by a variety of techniques, e.g., mechanical drilling, laser drilling, etc. In one particularly illustrative example, the opening 34 may have a generally circular configuration (viewed from above) and it may be formed by performing one or more mechanical or laser drilling processes. In one particular example, the opening 34 may have a diameter 36 of approximately 200-300 μm.

Figure 6C:
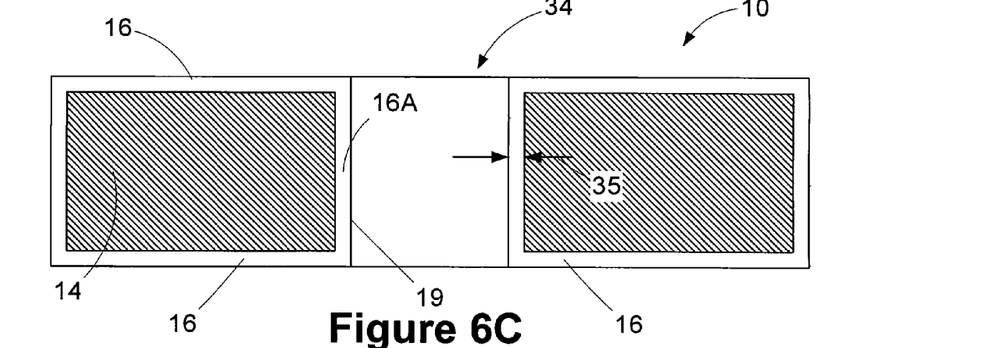

Next, as shown in FIG. 6C, a process is performed to form conductive material 16A within the opening 34. For example, the interposer structure 10 may be placed in an immersion bath wherein conductive material is formed on all contacted surfaces of the interposer structure 10. In one particular example, the interposer structure 10 may be placed in a copper immersion bath such that conductive copper material 16A may be formed within the opening 34. The thickness 35 of the conductive material formed during this process may vary depending upon the particular application. For example, the thickness 35 may be approximately 6 μm. The additional conductive material 16A defines an inner surface 19 of the first conductive structure 12A. The second conductive structure 12B will be formed within the area defined by the first conductive structure 12A. Additionally, the immersion process described above will result in additional conductive material being formed on the conductive material 16 that is part of the original interposer structure 10. For purposes of clarity, the additional conductive material formed on the conductive material of the original interposer structure 10 is not depicted in the drawings. The conductive material 16A formed within the opening 34 during this process may be of the same material or may be a different material from that of the conductive material 16 present on the initial interposer structure 10 depicted in FIG. 6A.

Figure 6D:
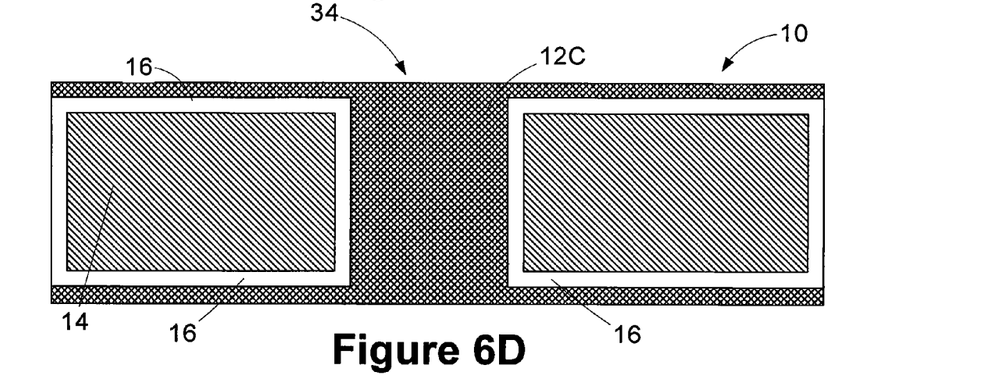

Then, as shown in FIG. 6D, in one illustrative embodiment, the insulating material 12C is formed in and outside of the opening 34. The insulating material 12C may be comprised of a variety of different materials depending upon the particular application. In one illustrative example, the insulating material 12C may be a high-k material having a dielectric constant greater than 5. Specific illustrative materials for the insulating material 12C may be materials such as solder mask material (Taiyo Ink brand—AUS308), via plugging material, epoxy, etc. The insulating material 12C may be positioned or formed in and outside of the opening 34 using a variety of known techniques depending upon the type of material employed. For example, well-known screen printing or solder mask plugging techniques may be employed to form the insulating material 12C and cure these materials if necessary. The insulating material 12C may also be formed by using an epoxy insulating material and curing the epoxy material. From the foregoing, it should be understood that the characteristics of the insulating material 12C and the manner in which it is formed may vary depending upon the particular application. Thus, the illustrative examples described above should not be considered a limitation of the present invention.

Figure 6E:
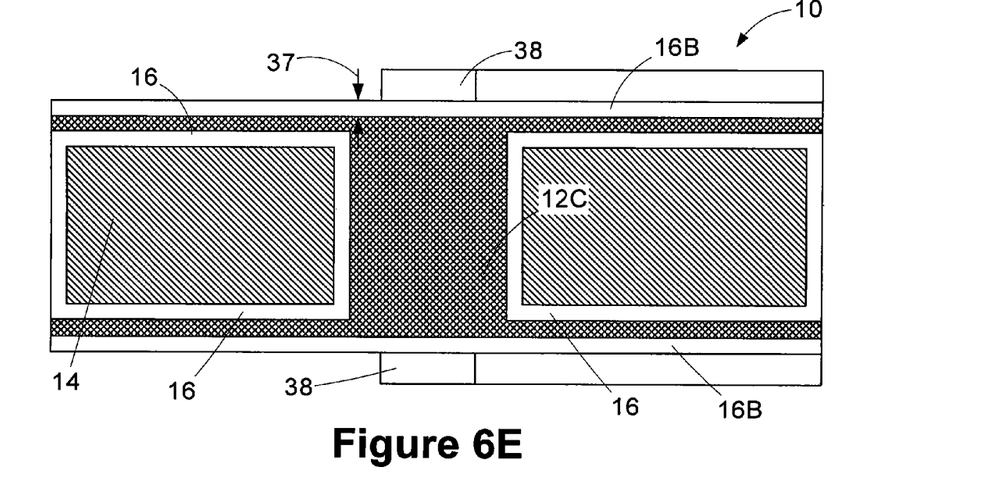
Figure 6F:
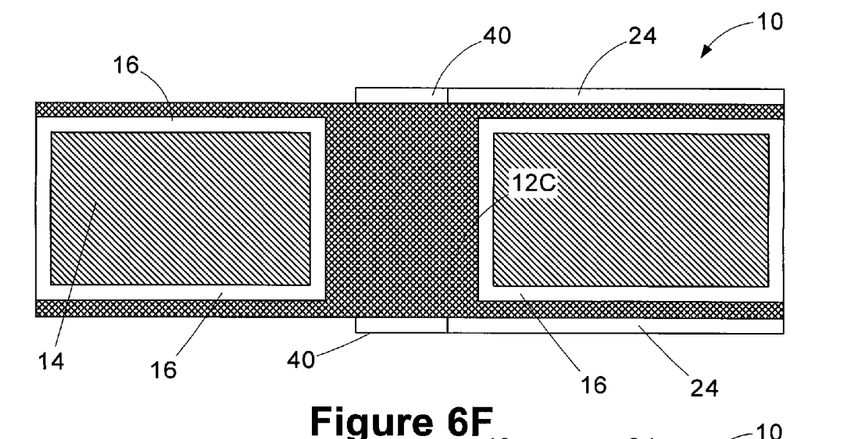

Next, as shown in FIG. 6E, additional conductive material 16B is formed on the exposed insulating material 12C. This additional conductive material may be formed by positioning the device shown in FIG. 6D in an immersion bath for a duration sufficient to form the additional conductive material 16B to a desired thickness. In one illustrative example, the process is performed until such time as the conductive material 16B has a thickness 37 of approximately 6-18 μm. Thereafter, a patterned masking layer 38 is formed. The patterned masking layer 38 may be comprised of a plurality of materials, e.g., photoresist. In the case where photoresist is employed, the patterned masking layer 38 may be formed using known photolithographic techniques. Thereafter, one or more etching processes are performed to pattern the conductive material 16B that is positioned above the insulating material 12C, and the patterned masking layer 38 is removed. This results in the structure depicted in FIG. 6F wherein conductive material regions 40 and the conductive wiring traces 24 are formed above the insulating material 12C. A variety of etching processes, wet or dry, may be performed to define the conductive material 40 and the wiring traces 24. In one particular example, a wet etching process is performed to define the conductive materials regions 40 and the wiring traces 24.

Figure 6G:
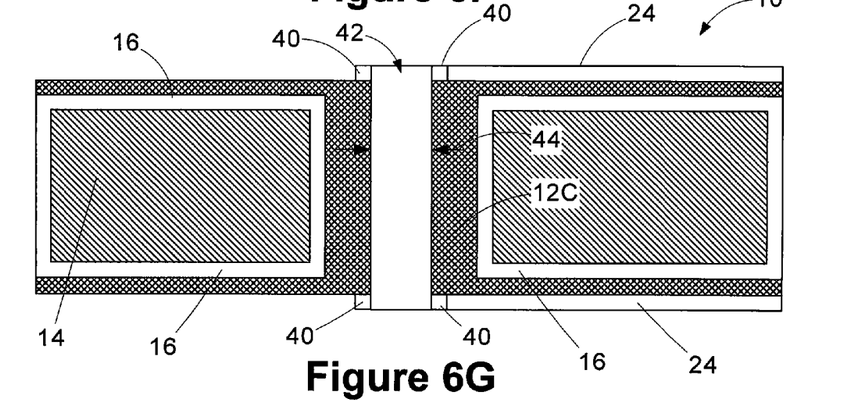
Figure 6H:
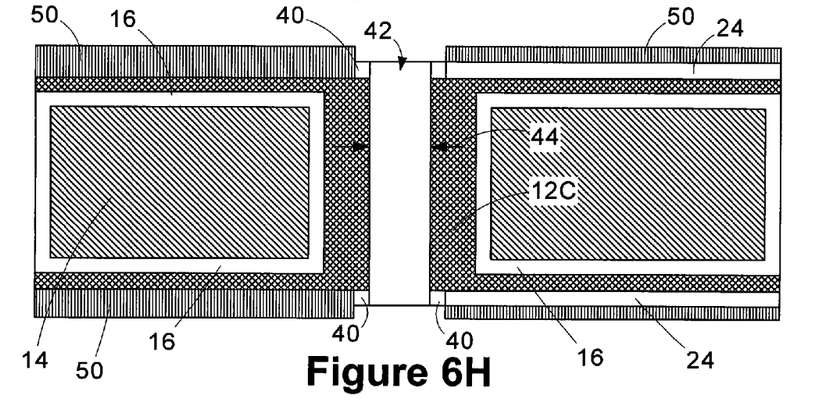

Next, as shown in FIG. 6G, an opening 42 is formed. The opening 42 may be of any desired shape, size or configuration, and it may be formed by a variety of techniques, e.g., mechanical drilling, laser drilling, etc. In one particularly illustrative example, the opening 42 may have a generally circular configuration (viewed from above) and it may be formed by performing one or more drilling processes, e.g., mechanical drilling, laser drilling, etc. In one particular example, the opening 42 may have a diameter 44 of approximately 200-350 μm. Then, as shown in FIG. 6H, a patterned masking layer 50, e.g., a patterned layer of photoresist, is formed on the device, using known techniques.

Figure 6I:
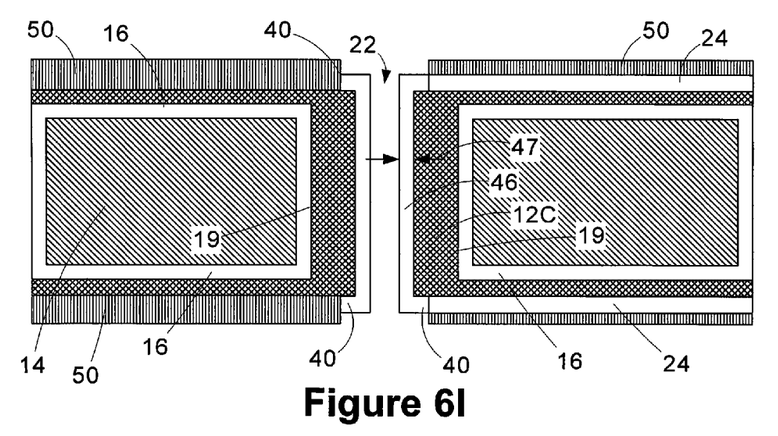

As shown in FIG. 6I, the next process involves forming additional conductive material 46 within the opening 42. The additional conductive material 46 may have a thickness 47 of approximately 3-6 μm. This additional conductive material 46 constitutes a portion of the second conductive structure 12B of the capacitor structure 12. Note that the second conductive structure 12B is formed with an area defined by the inner surface 19 (see FIG. 6C) of the first conductive structure 12A. This additional material 46 also approximately defines an opening 22. As before, this additional conductive material 46 may be formed by performing an immersion plating process.

Figure 6J:
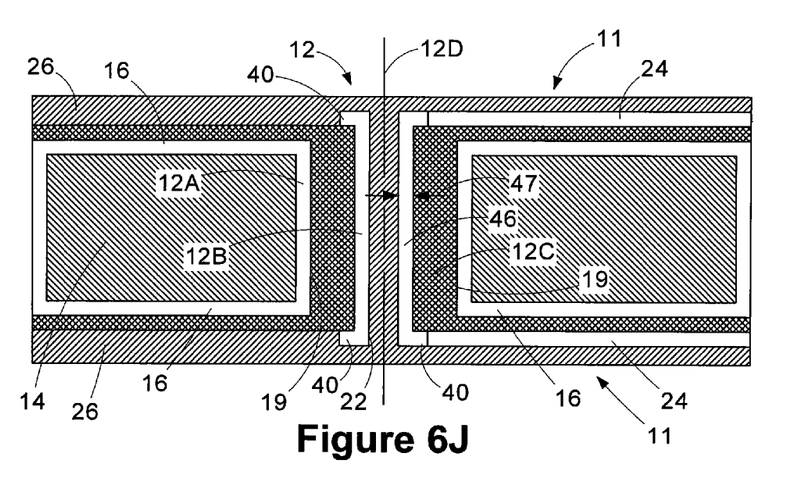

As shown in FIG. 6J, the patterned masking layer 50 is removed and an insulating material 26, e.g., solder mask AUS308 material or other like material, may be formed on the device and in the opening 22. The resulting capacitor structure 12 has a longitudinal axis 12D that is substantially perpendicular to the potential mounting surfaces 11 of the interposer structure 10.

As described above, the present disclosure is directed to an illustrative device which includes an interposer structure 10, at least one capacitor structure 12 formed at least partially within an opening 34 formed in the interposer structure 10 and an integrated circuit device structure 30 comprising an integrated circuit device 32, wherein the integrated circuit device structure 30 is operatively coupled to the interposer structure 10.

As another example, the present disclosure relates to a method that involves obtaining an interposer structure 10 having at least one capacitor structure 12 formed at least partially within an opening 34 in the interposer structure 10 and operatively coupling an integrated circuit device structure 30 to the interposer structure 10. In yet another illustrative example, the present disclosure relates to a method that includes obtaining an interposer structure 10 comprising a body of dielectric material 14 and conductive material formed on opposite sides of the interposer structure 10, forming an opening 34 in the interposer structure 10 and forming a capacitor structure 12 that is positioned at least partially within the opening 34.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

The invention claimed is:

1. A method of forming a capacitor in an interposer, comprising:
   forming a first opening through a thickness of the interposer;
   forming a conductive material on an inner surface of the first opening to at least partially define a first conductive structure of the capacitor;
   forming a dielectric material on an inner surface of the first conductive structure;
   forming a second opening that extends through the dielectric material;
   forming a conductive material within the second opening and on an inner surface of the dielectric material to at least partially define a second conductive structure of the capacitor; and
   forming an insulating material within the second conductive structure.

2. The method of claim 1 further comprising forming at least one conductive wiring trace that is conductively coupled to the second conductive structure.

3. The method of claim 1 further comprising positioning an integrated circuit above the interposer and coupling the integrated circuit to the interposer.

4. The method of claim 1 wherein the second conductive structure has a longitudinal axis oriented substantially perpendicular to a mounting surface of the interposer structure.

5. The method of claim 1 wherein forming the conductive material on the inner surface of the first opening comprises forming the conductive material on the inner surface of the first opening such that the conductive material is conductively coupled to a conductive material positioned on an outer surface of the interposer.

6. A method of forming a capacitor in an interposer, comprising:

lining an opening defined in an interposer with a first conductive structure;

lining the first conductive structure with a dielectric material;

lining the dielectric material with a second conductive structure; and forming an insulating material within the second conductive structure.

7. The method of claim 6 further comprising forming at least one conductive wiring trace conductively coupled to the second conductive structure.

8. The method of claim 6 further comprising positioning an integrated circuit above the first and second conductive structures and coupling the integrated circuit to the interposer.

9. The method of claim 6 wherein the opening in the interposer has a longitudinal axis substantially perpendicular to a mounting surface of the interposer.

10. The method of claim 6 with the second conductive structure co-axial with the first conductive structure.

11. The method of claim 6 with the first conductive structure extending substantially entirely through the thickness of the interposer.

12. The method of claim 6 further comprising forming a first conductive trace on a first side of the interposer electrically coupled to a first end of the first conductive structure and forming a second conductive trace on a second side of the interposer electrically coupled to a second end of the second conductive structure.

* * * * *